(12) United States Patent
Mitani et al.

(10) Patent No.: US 9,048,401 B2
(45) Date of Patent: Jun. 2, 2015

(54) PRODUCING METHOD OF SEMICONDUCTOR DEVICE

(71) Applicant: NITTO DENKO CORPORATION, Ibaraki-shi, Osaka (JP)

(72) Inventors: Munehisa Mitani, Ibaraki (JP); Yuki Ebe, Ibaraki (JP); Yasunari Ooyabu, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 90 days.

(21) Appl. No.: 13/944,577

(22) Filed: Jul. 17, 2013

(65) Prior Publication Data

US 2014/0024153 A1    Jan. 23, 2014

(30) Foreign Application Priority Data

Jul. 17, 2012  (JP) .................................. 2012-158945
Jun. 26, 2013  (JP) .................................. 2013-133413

(51) Int. Cl.
 *H01L 33/52*     (2010.01)
 *H01L 33/00*     (2010.01)
 *H01L 21/56*     (2006.01)

(52) U.S. Cl.
 CPC .............. *H01L 33/52* (2013.01); *H01L 33/005* (2013.01); *H01L 2933/005* (2013.01); *H01L 21/56* (2013.01); *H01L 2224/48137* (2013.01); *H01L 2224/48091* (2013.01)

(58) Field of Classification Search
 CPC ....... H01L 33/005; H01L 33/52; H01L 21/56; H01L 2933/005; H01L 2224/48091; H01L 2924/00014; H01L 2224/48137
 USPC ........ 438/26, 22, 25, 27, 29, 127; 257/88, 98, 257/E33.061, E27.12
 See application file for complete search history.

(56) References Cited

U.S. PATENT DOCUMENTS

2011/0309384 A1* 12/2011 Ito et al. ......................... 257/88

FOREIGN PATENT DOCUMENTS

JP         2010-123802 A      6/2010

* cited by examiner

*Primary Examiner* — Thinh T Nguyen
(74) *Attorney, Agent, or Firm* — Sughrue Mion, PLLC

(57) ABSTRACT

A method for producing a semiconductor device includes a preparing step of preparing a board formed with a concave portion, a terminal disposed in or around the concave portion, and a semiconductor element disposed in the concave portion; a wire-bonding step of connecting the terminal to the semiconductor element with a wire; a pressure-welding step of pressure-welding an encapsulating sheet to the board so as to be in close contact with the upper surface of a portion around the concave portion and to be separated from the upper surface of the concave portion under a reduced pressure atmosphere; and an atmosphere releasing step of releasing the board and the encapsulating sheet under an atmospheric pressure atmosphere.

8 Claims, 3 Drawing Sheets

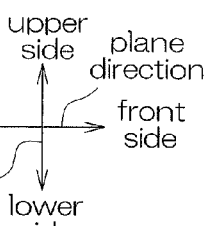
FIG.1
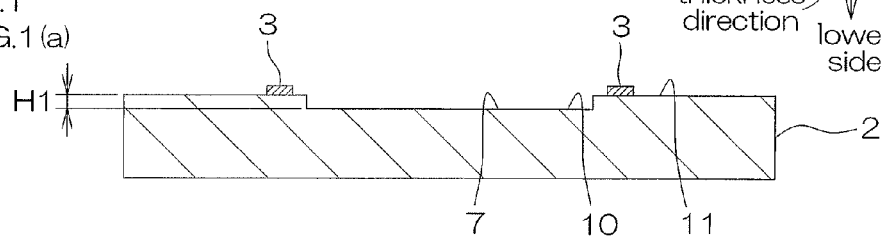
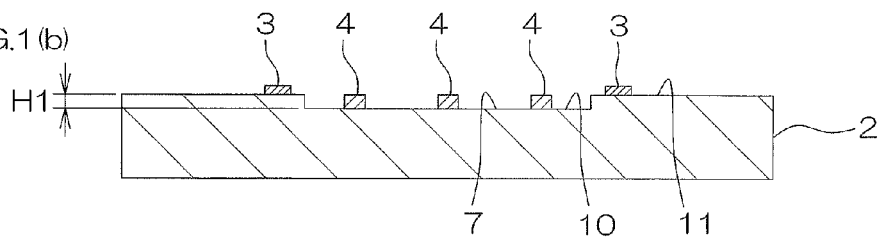
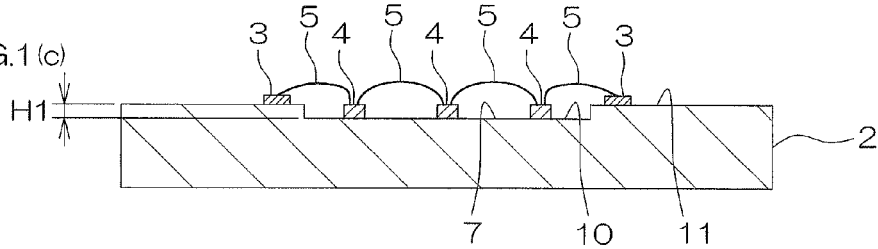
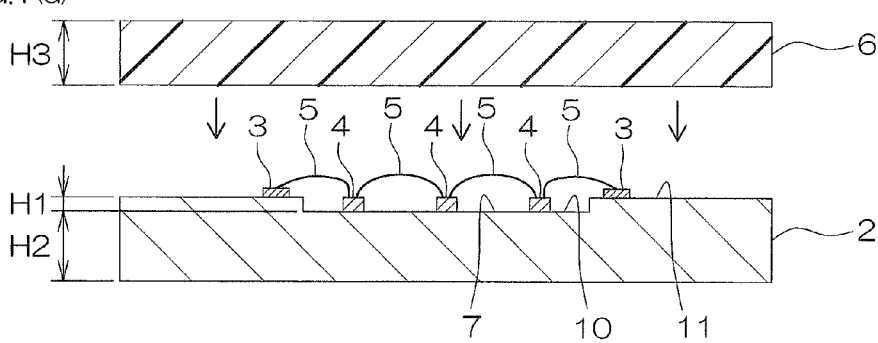

FIG.2
FIG.2(e)
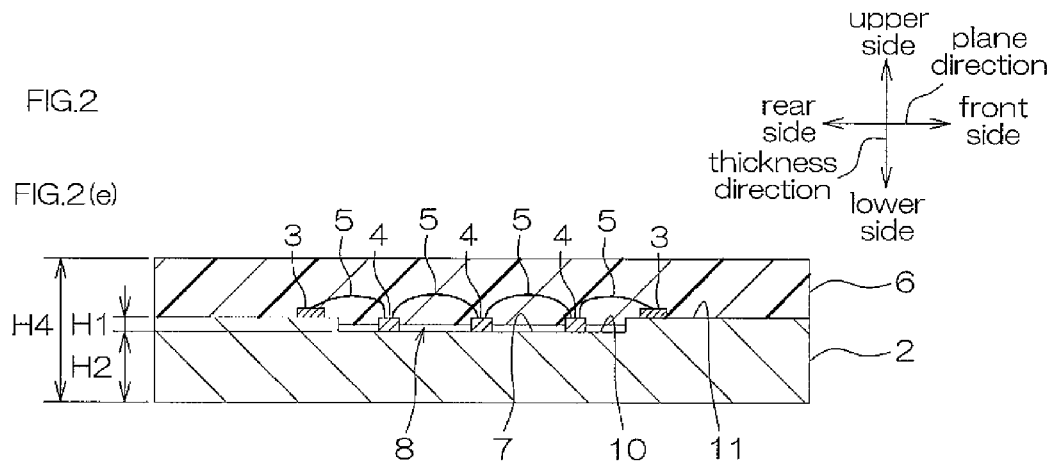
FIG.2(f)
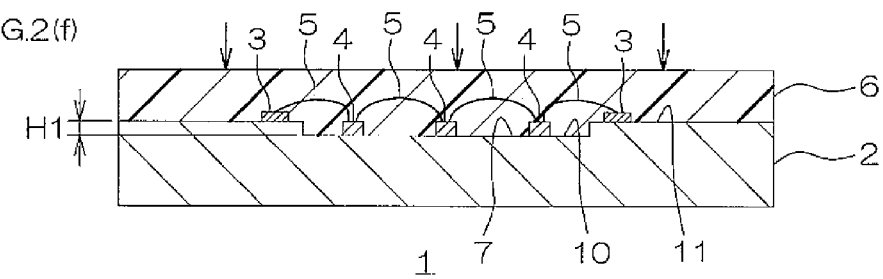
FIG.2(g)
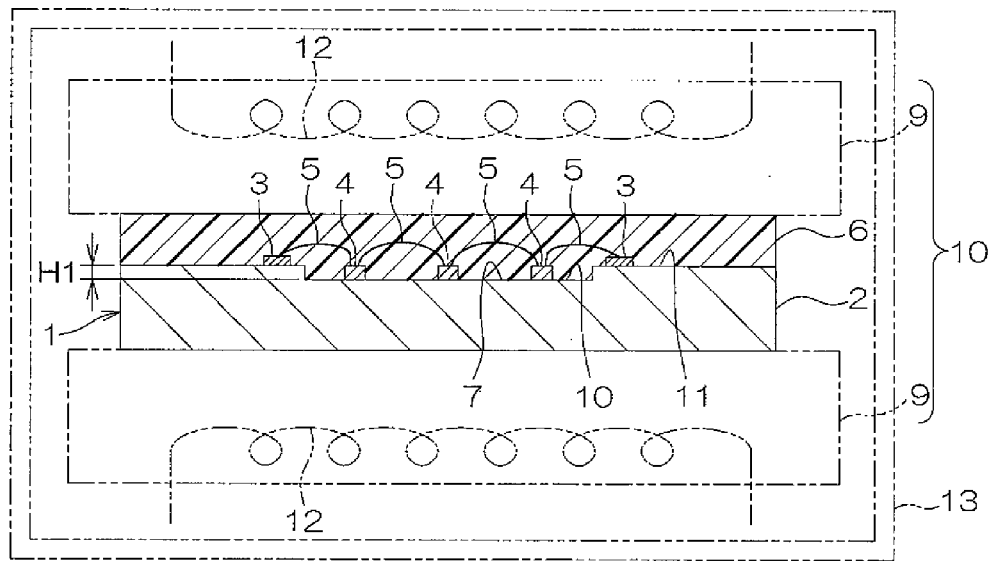

PRODUCING METHOD OF SEMICONDUCTOR DEVICE

CROSS-REFERENCE TO RELATED APPLICATION

The present application claims priority from Japanese Patent Application No. 2012-158945 filed on Jul. 17, 2012 and Japanese Patent Application No. 2013-133413 filed on Jun. 26, 2013, the contents of which are hereby incorporated by reference into this application.

BACKGROUND OF THE INVENTION

1. Field of the Invention

The present invention relates to a method for producing a semiconductor device.

2. Description of Related Art

It has been conventionally known that a semiconductor element such as a light emitting diode (LED) is encapsulated by a resin.

It has been, for example, proposed that an optical semiconductor encapsulating sheet that has a resin layer made from a silicone resin is provided on an LED chip-mounted board that is mounted with an LED chip and the optical semiconductor encapsulating sheet is heated and pressurized toward the LED chip-mounted board to encapsulate the LED chip by the resin layer (ref: for example, Japanese Unexamined Patent Publication No. 2010-123802).

SUMMARY OF THE INVENTION

In the method described in Japanese Unexamined Patent Publication No. 2010-123802, however, when the LED chip-mounted board in which the LED chip is connected to the board with a wire (in other words, a wire bonding type) is encapsulated, there may be a case where the wire is pressed by the resin layer to be deformed (tilted) by excessive pressing of the optical semiconductor encapsulating sheet toward the LED chip-mounted board.

When the wire is deformed, there may be a case where the connection between the wire and the LED chip or the board is broken.

On the other hand, when the pressing of the optical semiconductor encapsulating sheet is insufficient, a void may be generated between the optical semiconductor encapsulating sheet and the LED chip-mounted board.

When the void is generated, there is a disadvantage that the LED chip-mounted board is not capable of being surely encapsulated.

It is an object of the present invention to provide a method for producing a semiconductor device that is capable of reducing a deformation of a wire and suppressing generation of a void at the time of encapsulating a semiconductor element.

A method for producing a semiconductor device of the present invention includes a preparing step of preparing a board formed with a concave portion, a terminal disposed in or around the concave portion, and a semiconductor element disposed in the concave portion; a wire-bonding step of connecting the terminal to the semiconductor element with a wire; a pressure-welding step of pressure-welding an encapsulating sheet to the board so as to be in close contact with the upper surface of a portion around the concave portion and to be separated from the upper surface of the concave portion under a reduced pressure atmosphere; and an atmosphere releasing step of releasing the board and the encapsulating sheet under an atmospheric pressure atmosphere.

In the method for producing a semiconductor device of the present invention, it is preferable that after the atmosphere releasing step, a two-step heating step in which heating is performed at a first temperature and thereafter, heating is performed at a second temperature that is higher than the first temperature is further included.

In the method for producing a semiconductor device of the present invention, it is preferable that the first temperature has a heating temperature range in which the temperature increases to the second temperature.

In the method for producing a semiconductor device of the present invention, it is preferable that in the two-step heating step, the encapsulating sheet is mechanically pressurized when heated at the first temperature.

In the method for producing a semiconductor device of the present invention, it is preferable that the encapsulating sheet is prepared from an encapsulating resin composition containing a two-step thermosetting resin, and in the two-step heating step, the encapsulating sheet is in a B-stage state when heated at the first temperature and the encapsulating sheet is in a C-stage state when heated at the second temperature.

In the method for producing a semiconductor device of the present invention, it is preferable that after the atmosphere releasing step, a heating and fluid-pressurizing step in which the encapsulating sheet is heated and fluid-pressurized is further included.

In the method for producing a semiconductor device of the present invention, it is preferable that in the pressure-welding step, the encapsulating sheet has a compressive elastic modulus of 0.16 MPa or less.

In the method for producing a semiconductor device of the present invention, it is preferable that the length between the upper surface of the concave portion and the upper surface of the portion around the concave portion is 500 μm or less.

According to the method for producing a semiconductor device of the present invention, in the pressure-welding step, the encapsulating sheet is pressure-welded to the board so as to be separated from the upper surface of the concave portion.

Thus, the pressing force of the encapsulating sheet with respect to the wire at the time of pressure-welding thereof is capable of being reduced.

On the other hand, in the pressure-welding step, the encapsulating sheet confines the upper surface of a portion around the concave portion under a reduced pressure atmosphere, so that a reduced pressure space that is, in the concave portion, defined by the board and the encapsulating sheet and is sealed is formed.

Thus, in the atmosphere releasing step, when the atmosphere is released, the encapsulating sheet fills the concave portion without any space by a differential pressure between a pressure in the reduced pressure space and the atmospheric pressure.

Thus, generation of a void between the board and the encapsulating sheet is capable of being suppressed.

As a result, a deformation of a wire is capable of being reduced and the generation of the void is capable of being suppressed.

BRIEF DESCRIPTION OF THE DRAWINGS

FIG. 1 shows process drawings for illustrating one embodiment of a method for producing a semiconductor device of the present invention:

FIG. 1 (a) and FIG. 1 (b) illustrating a step of preparing a board in which a concave portion is formed, terminals that are disposed around the concave portion, and semiconductor elements that are disposed in the concave portion (a preparing step), FIG. 1 (c) illustrating a step of connecting the terminals to the semiconductor elements with wires (a wire-bonding step), and FIG. 1 (d) illustrating a step of disposing an encapsulating sheet in opposed relation to the upper side of the board (an opposingly disposing step).

FIG. 2 shows process drawings for illustrating one embodiment of a method for producing a semiconductor device of the present invention, subsequent to FIG. 1:

FIG. 2 (e) illustrating a step of pressure-welding the encapsulating sheet to the board so as to be in close contact with the upper surface of a portion around the concave portion and to be separated from the upper surface of the concave portion under a reduced pressure atmosphere (a pressure-welding step), FIG. 2 (f) illustrating a step of releasing the board and the encapsulating sheet under an atmospheric pressure atmosphere (an atmosphere releasing step), and FIG. 2 (g) illustrating a step of, after the atmosphere releasing step, curing the encapsulating sheet (a curing step).

DETAILED DESCRIPTION OF THE INVENTION

Figure 3:
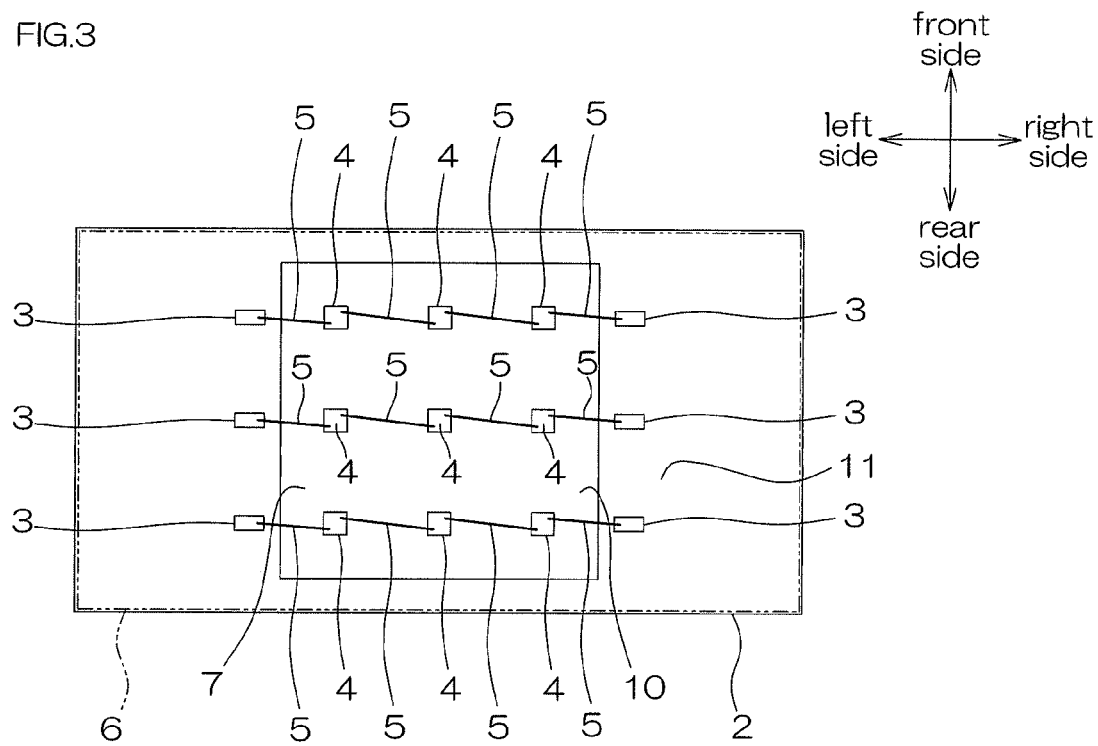
FIG. 3 shows a plan view of the board shown in FIG. 1 (b).

FIGS. 1 and 2 show process drawings for illustrating one embodiment of a method for producing a semiconductor device of the present invention. FIG. 3 shows a plan view of the board shown in FIG. 1 (b).

In referring to directions, a direction in which a board 2 is horizontally disposed is referred to as a reference. To be specific, arrow directions shown in each views are referred to as a reference.

In FIGS. 1 to 4, the right-left direction is referred to as a first direction and in FIG. 2, the front-rear direction that is perpendicular to the right-left direction is referred to as a second direction. The left side is referred to as one side in the first direction; the right side is referred to as the other side in the first direction; the front side is referred to as one side in the second direction; and the rear side is referred to as the other side in the second direction.

A method for producing a semiconductor device of the present invention includes a preparing step, a wire-bonding step, a pressure-welding step (including an opposingly disposing step), and an atmosphere releasing step.

[Preparing Step]

The preparing step is a step of preparing the board 2 in which terminals 3 and light emitting diodes (hereinafter, referred to as LEDs 4) as one example of semiconductor elements are disposed.

As shown in FIG. 3, the board 2 is formed into a flat plate shape in a generally rectangular shape in plane view having a concave portion 7 at generally center thereof in the plane direction (the front-rear and the right-left directions).

The board 2 is formed of a material that is generally used in a board of a semiconductor device, such as a metal material including aluminum, a ceramic material including alumina, and a resin material including polyimide.

The board 2 may be integrally formed of the above-described material. Alternatively, the board 2 can be also formed of two or more materials so that the board 2 includes a flat plate made of the above-descried material and a wired circuit board provided to surround the center of the upper surface of the flat plate and that a portion surrounded by the wired circuit board is formed as the concave portion 7.

The length of one side of the board 2 is, for example, 1 mm or more, and is, for example, 1000 mm or less.

The thickness of the board 2 is, for example, 0.7 mm or more, or preferably 0.9 mm or more, and is, for example, 10 mm or less, or preferably 5 mm or less.

The concave portion 7 is formed so as to dent downwardly in a square shape in plane view in the upper surface of the board 2 (ref: FIG. 1 (a)) and is surrounded by a portion other than the concave portion 7 (the circumference) of the board 2 around the concave portion 7 in all directions (the front-rear and the right-left directions) without any space.

The length of one side of the concave portion 7 is, for example, 0.8 mm or more, or preferably 1 mm or more, and is, for example, 300 mm or less, or preferably 100 mm or less.

A depth H1 (a length, in the up-down direction, between the upper surface of a portion around the concave portion 7 (hereinafter, referred to as a circumferential upper surface 11) and the upper surface of the concave portion 7 (hereinafter, referred to as a concave upper surface 10)) of the concave portion 7 is, for example, 1000 μm or less, preferably 500 μm or less, more preferably 200 μm or less, or particularly preferably 170 μm or less, and is, for example, 10 μm or more, or preferably 50 μm or more.

The depth H1 of the concave portion 7 with respect to the thickness of the board 2 is, for example, 90% or less, or preferably 80% or less, and is, for example, 10% or more, or preferably 20% or more.

In the board 2, a plurality of the terminals 3 and a plurality of the LEDs 4 are disposed.

The terminals 3 are respectively, on the circumferential upper surface 11 of the board 2, provided near the two sides that are opposed to each other by sandwiching the concave portion 7 therebetween.

To be specific, a plurality (three pieces) of the terminals 3 are disposed at spaced intervals to each other in the front-rear direction on the circumferential upper surface 11 at the left side of the concave portion 7 in the right-left direction. Also, corresponding to those, a plurality (three pieces) of the terminals 3 are disposed at spaced intervals to each other in the front-rear direction on the circumferential upper surface 11 at the right side of the concave portion 7 in the right-left direction.

An electric power from an external power source is supplied to each of the terminals 3.

A plurality (three pieces) of the LEDs 4 are, in the concave portion 7 of the board 2, disposed in parallel at spaced intervals to each other in the right-left direction and are disposed in parallel in a plurality (three) of rows at spaced intervals to each other in the front-rear direction.

Each of the LEDs 4 is formed into a flat plate shape in a generally rectangular shape in plane view and is provided with a terminal (not shown) on the upper surface thereof.

The length of one side of the LED 4 is, for example, 0.05 mm or more, or preferably 0.1 mm or more, and is, for example, 10 mm or less, or preferably 5 mm or less.

The thickness of the LED 4 is, for example, 5 μm or more, or preferably 10 μm or more, and is, for example, 2000 μm or less, or preferably 1000 μm or less.

The thickness of the LED 4 with respect to the depth H1 of the concave portion 7 is, for example, 90% or less, or preferably 80% or less.

The gap in the front-rear direction and the right-left direction of the LEDs 4 is, for example, 0.1 mm or more, or preferably 1 mm or more, and is, for example, 50 mm or less, or preferably 5 mm or less.

The sum total of the area of a plurality of the LEDs 4 in plane view with respect to the area of the concave portion 7 is, for example, 0.01% or more, or preferably 0.1% or more, and is, for example, 99.99% or less, or preferably 99.9% or less.

[Wire-Bonding Step]

The wire-bonding step is a step of connecting each of the terminals 3 to each of the LEDs 4 with each of wires 5.

A plurality of the wires 5 are provided corresponding to a plurality of the LEDs 4.

An example of a material for the wire 5 includes a material used as a wire-bonding material of a semiconductor, such as gold, silver, or copper. Preferably, in view of corrosion resistance, gold is used.

The wire 5 is formed from the above-described material into a linear shape. The wire diameter (thickness) of the wire 5 is, for example, 10 μm or more, or preferably 30 μm or more, and is, for example, 100 μm or less, or preferably 50 μm or less.

When the wire diameter of the wire 5 is less than the above-described range, there may be a case where the strength of the wire 5 is reduced and the wire 5 is easily deformed. When the wire diameter of the wire 5 is above the above-described range, in a case where the cost of a semiconductor device is increased, the area that blocks light emission from the LED 4 may be increased.

The terminal on the upper surface of the LED 4 at the left side is electrically connected to the terminal 3 at the left side corresponding thereto in the right-left direction with the wire 5.

The terminal on the upper surface of the LED 4 at the right side is electrically connected to the terminal 3 at the right side corresponding thereto in the right-left direction with the wire 5.

The terminals on the upper surfaces of the LEDs 4 that are adjacent to each other in the right-left direction are electrically connected to each other with the wire 5.

By those connections, the wires 5, each of which electrically connects the LED 4 to the terminal 3 or electrically connects the LEDs 4 to themselves, are disposed in three rows at spaced intervals to each other in the front-rear direction.

As shown in FIG. 1 (*b*), in a state of connecting the LED 4 to the terminal 3, the wire 5 is curved or bended and is formed to be a generally arc shape (for example, a triangular arc shape, a quadrangular arc shape, or a circular arc shape). The top of the curved wire 5 is disposed at the upper side, compared to the circumferential upper surface 11.

After the wire-bonding step, when an electric power from an external power source is supplied to a plurality of the terminals 3, a plurality of the LEDs 4 emit light.

[Pressure-Welding Step]

The pressure-welding step is a step of pressure-welding an encapsulating sheet 6 to the board 2 so as to be in close contact with the circumferential upper surface 11 and to be separated from the concave upper surface 10 under a reduced pressure atmosphere.

The encapsulating sheet 6 is formed from an encapsulating resin composition containing an encapsulating resin.

Examples of the encapsulating resin include a thermoplastic resin that is plasticized by heating, a thermosetting resin that is cured by heating, and an active energy ray curable resin that is cured by application of an active energy ray (for example, an ultraviolet ray and an electron beam).

Examples of the thermoplastic resin include a vinyl acetate resin, an ethylene-vinyl acetate copolymer (EVA), a vinyl chloride resin, and an EVA-vinyl chloride resin copolymer.

Examples of the thermosetting resin and the active energy ray curable resin include a silicone resin, an epoxy resin, a polyimide resin, a phenol resin, a urea resin, a melamine resin, and an unsaturated polyester resin.

As the encapsulating resin, preferably, a thermosetting resin is used.

Examples of a resin composition containing the thermosetting resin include a two-step thermosetting resin composition and a one-step thermosetting resin composition. Preferably, a two-step thermosetting resin composition is used.

Examples of the two-step thermosetting resin composition include a two-step curable type silicone resin composition and a two-step curable type epoxy resin composition. Preferably, a two-step curable type silicone resin composition is used.

Examples of the one-step thermosetting resin composition include a one-step curable type silicone resin composition and a one-step curable type epoxy resin composition. Preferably, a one-step curable type silicone resin composition is used.

The two-step curable type silicone resin composition is a thermosetting silicone resin composition that has a two-step reaction mechanism and in which a silicone resin composition is brought into a B-stage state (a semi-cured state) in the first-step reaction and is brought into a C-stage state (subjected to a final curing) in the second-step reaction.

The B-stage state is a state between an A-stage state in which an encapsulating resin composition is soluble in a solvent and a C-stage state in which the encapsulating resin composition is subjected to a final curing. Also, the B-stage state is a state in which the curing and the gelation of the encapsulating resin composition are slightly progressed, and in which the encapsulating resin composition swells in a solvent but is not completely dissolved therein and is softened but is not melted by heating.

An example of an uncured material (before the first-step curing) of the two-step curable type silicone resin composition includes a condensation reaction and addition reaction curable type silicone resin composition.

The condensation reaction and addition reaction curable type silicone resin composition is a thermosetting silicone resin composition that is capable of undergoing a condensation reaction and an addition reaction by heating. To be specific, the condensation reaction and addition reaction curable type silicone resin composition is a thermosetting silicone resin composition that is capable of undergoing a condensation reaction to be brought into a B-stage state (a semi-cured state) by heating and is capable of undergoing an addition reaction (to be specific, for example, a hydrosilylation reaction) to be brought into a C-stage state (a final curing state) by further heating.

Examples of the condensation reaction and addition reaction curable type silicone resin composition include a first condensation reaction and addition reaction curable type silicone resin composition that contains a polysiloxane containing silanol groups at both ends, an alkenyl group-containing trialkoxysilane, an organohydrogensiloxane, a condensation catalyst, and a hydrosilylation catalyst; a second condensation reaction and addition reaction curable type silicone resin composition that contains a polysiloxane containing silanol groups at both ends, an ethylenically unsaturated hydrocarbon group-containing silicon compound (hereinafter, defined as an ethylenic silicon compound), an epoxy group-containing silicon compound, an organohydrogensiloxane, a condensation catalyst, and an addition catalyst (a hydrosilylation catalyst); a third condensation reaction and addition reaction curable type silicone resin composition that contains a silicone oil containing silanol groups at both ends, an alkenyl group-containing dialkoxyalkylsilane, an organohydrogensiloxane, a condensation catalyst, and a hydrosilylation catalyst; a fourth condensation reaction and addition reaction curable type silicone resin composition that contains an organopolysiloxane having, in one molecule, at least two alkenylsilyl groups, an organopolysiloxane having, in one molecule, at least two hydrosilyl groups, a hydrosilylation catalyst, and a curing retarder; a fifth condensation reaction and addition reaction curable type silicone resin composition that contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; a sixth condensation reaction and addition reaction curable type silicone resin composition that contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, a hydrosilylation retarder, and a hydrosilylation catalyst; a seventh condensation reaction and addition reaction curable type silicone resin composition that contains a silicon compound, and a boron compound or an aluminum compound; and an eighth condensation reaction and addition reaction curable type silicone resin composition that contains a polyaluminosiloxane and a silane coupling agent.

These condensation reaction and addition reaction curable type silicone resin compositions can be used alone or in combination of two or more.

As the condensation reaction and addition reaction curable type silicone resin composition, preferably, a fourth condensation reaction and addition reaction curable type silicone resin composition is used.

The fourth condensation reaction and addition reaction curable type silicone resin composition is described in Japanese Unexamined Patent Publication No. 2011-219597 or the like and contains, for example, a dimethylvinylsilyl-terminated polydimethylsiloxane, a trimethylsilyl-terminated dimethylsiloxane-methylhydrosiloxane copolymer, a platinum-divinyltetramethyldisiloxane complex, and a tetramethylammonium hydroxide.

On the other hand, the one-step curable type silicone resin composition is a thermosetting silicone resin composition that has a one-step reaction mechanism and in which a silicone resin composition is subjected to a final curing in the first-step reaction.

An example of the one-step curable type silicone resin composition includes an addition reaction curable type silicone resin composition.

The addition reaction curable type silicone resin composition contains, for example, an ethylenically unsaturated hydrocarbon group-containing polysiloxane, which serves as a main agent, and an organohydrogensiloxane, which serves as a cross-linking agent.

Examples of the ethylenically unsaturated hydrocarbon group-containing polysiloxane include an alkenyl group-containing polydimethylsiloxane, an alkenyl group-containing polymethylphenylsiloxane, and an alkenyl group-containing polydiphenylsiloxane.

In the addition reaction curable type silicone resin composition, the ethylenically unsaturated hydrocarbon group-containing polysiloxane and the organohydrogensiloxane are usually provided in separate packages. To be specific, the addition reaction curable type silicone resin composition is provided as two liquids of A liquid that contains a main agent (the ethylenically unsaturated hydrocarbon group-containing polysiloxane) and B liquid that contains a cross-linking agent (the organohydrogensiloxane). A known catalyst that is necessary for the addition reaction of both components is added in the ethylenically unsaturated hydrocarbon group-containing polysiloxane.

In the addition reaction curable type silicone resin composition, the main agent (A liquid) and the cross-linking agent (B liquid) are mixed to prepare a liquid mixture. In a step of forming the liquid mixture into the above-described shape of the encapsulating sheet 6, the ethylenically unsaturated hydrocarbon group-containing polysiloxane and the organohydrogensiloxane are subjected to an addition reaction and the addition reaction curable type silicone resin composition is cured, so that a silicone elastomer (a cured material) is formed.

The mixing ratio of the encapsulating resin with respect to 100 parts by mass of the encapsulating resin composition is, for example, 20 parts by mass or more, or preferably 50 parts by mass or more, and is, for example, 99.9 parts by mass or less, or preferably 99.5 parts by mass or less.

A phosphor and a filler can be contained in the encapsulating resin composition at an appropriate proportion as required.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce; a silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; an aluminate phosphor such as $CaAl_{12}O_{19}$:Mn and $SrAl_2O_4$:Eu; a sulfide phosphor such as ZnS:Cu,Al, CaS:Eu, $CaGa_2S_4$:Eu, and $SrGa_2S_4$:Eu; an oxynitride phosphor such as $CaSi_2O_2N_2$:Eu, $SrSi_2O_2N_2$:Eu, $BaSi_2O_2N_2$:Eu, and Ca-α-SiAlON; a nitride phosphor such as $CaAlSiN_3$:Eu and $CaSi_5N_8$:Eu; and a fluoride-based phosphor such as $K_2SiF_6$:Mn and $K_2TiF_6$:Mn. Preferably, a garnet type phosphor is used, or more preferably, $Y_3Al_5O_{12}$:Ce is used.

Examples of a shape of the phosphor include a sphere shape, a plate shape, and a needle shape. Preferably, in view of fluidity, a sphere shape is used.

The average value of the maximum length (in the case of a sphere shape, the average particle size) of the phosphor is, for example, 0.1 μm or more, or preferably 1 μm or more, and is, for example, 200 μm or less, or preferably 100 μm or less.

The mixing ratio of the phosphor with respect to 100 parts by mass of the encapsulating resin composition is, for example, 0.1 parts by mass or more, or preferably 0.5 parts by mass or more, and is, for example, 80 parts by mass or less, or preferably 50 parts by mass or less.

Examples of the filler include silicone microparticles, glass, alumina, silica (fused silica, crystalline silica, ultrafine amorphous silica, hydrophobic ultrafine silica, and the like), titania, zirconia, talc, clay, and barium sulfate. These fillers can be used alone or in combination of two or more. Preferably, silicone microparticles and silica are used.

The mixing ratio of the filler with respect to 100 parts by mass of the encapsulating resin composition is, for example, 0.1 parts by mass or more, or preferably 0.5 parts by mass or more, and is, for example, 80 parts by mass or less, or preferably 50 parts by mass or less.

In addition, a known additive can be added to the encapsulating resin composition at an appropriate proportion. Examples of the known additive include modifiers, surfactants, dyes, pigments, discoloration inhibitors, and ultraviolet absorbers.

When the thermosetting silicone resin composition is a two-step curable type silicone resin composition, the encapsulating sheet 6 is prepared from a first-step cured material of the two-step curable type silicone resin composition and when the thermosetting silicone resin composition is a one-step curable type silicone resin composition, the encapsulating sheet 6 is prepared from an uncured material (before curing) of the one-step curable type silicone resin composition.

Particularly preferably, the encapsulating sheet 6 is a first-step cured material of the two-step curable type silicone resin composition.

In order to form the encapsulating sheet 6, for example, the above-described encapsulating resin composition (containing a fluorescent agent, a filler, or the like as required) is applied onto a releasing film that is not shown so as to have an appropriate thickness by an application method such as a casting, a spin coating, or a roll coating and the applied product is heated as required. In this way, the encapsulating sheet 6 in a sheet shape can be formed.

The encapsulating sheet 6 has a compressive elastic modulus at 23° C. of, for example, 2.0 MPa or less, preferably 1.6 MPa or less, more preferably 0.8 MPa or less, or particularly preferably 0.5 MPa or less, and of, for example, 0.01 MPa or more, or preferably 0.04 MPa or more.

When the compressive elastic modulus of the encapsulating sheet 6 is not more than the above-described upper limit, the flexibility can be secured. On the other hand, when the compressive elastic modulus of the encapsulating sheet 6 is not less than the above-described lower limit, the LEDs 4 can be embedded.

The encapsulating sheet 6 is formed to have a size that is capable of collectively encapsulating a plurality of the LEDs 4 and a plurality of the wires 5 and is capable of confining the concave portion 7.

To be specific, the length of the encapsulating sheet 6 in the front-rear direction is, for example, not less than the length of the concave portion 7 in the front-rear direction and is, for example, not more than the length of the board 2 in the front-rear direction.

Also, the length of the encapsulating sheet 6 in the right-left direction is, for example, not less than the length of the concave portion 7 in the right-left direction and is, for example, not more than the length of the board 2 in the right-left direction.

To be specific, as shown with the phantom line in FIG. 3, the encapsulating sheet 6 is formed into a sheet shape in a rectangular shape in plane view.

The thickness of the encapsulating sheet 6 is, for example, 100 μm or more, preferably 300 μm or more, or more preferably 400 μm or more, and is, for example, 2000 μm or less, or preferably 1000 μm or less.

As shown in FIG. 1 (d), the thickness H3 of the encapsulating sheet 6 with respect to the depth H1 of the concave portion 7 is, for example, 50% or more, preferably 80% or more, or more preferably 100% or more, and is, for example, 900% or less, preferably 700% or less, or more preferably 400% or less.

In the pressure-welding step, first, the encapsulating sheet 6 is disposed in opposed relation at spaced intervals to the upper side of the board 2 and then, is put into a vacuum chamber such as a vacuum pressing machine.

Next, the pressure in the vacuum chamber is reduced. To be specific, the pressure in the vacuum chamber is evacuated with a vacuum pump (a pressure-reducing pump) or the like.

As shown in FIG. 2 (e), the inside of the vacuum chamber is brought into a reduced pressure atmosphere and the encapsulating sheet 6 is pressure-welded to the board 2 with a pressing machine of the vacuum pressing machine or the like.

The reduced pressure atmosphere in the pressure-welding step is, for example, 300 Pa or less, preferably 100 Pa or less, or particularly preferably 50 Pa or less.

In the pressure-welding in the pressure-welding step, the amount (hereinafter, defined as a pushed-in amount) in which the encapsulating sheet 6 is pushed into (pressure-welded to) the side of the board 2 (the lower side) is controlled.

By controlling the pushed-in amount, the lower surface of the encapsulating sheet 6 is adjusted so as to be in close contact with the circumferential upper surface 11 and to be separated from the concave upper surface 10.

To be specific, the encapsulating sheet 6 is adjusted so that the pushed-in amount shown in the following formula is minus and the absolute value of the pushed-in amount is smaller than the depth H1 of the concave portion 7.

Pushed-in amount=(height H2 of the concave upper surface 10 with the bottom surface of the board 2 as a reference+thickness H3 of the encapsulating sheet 6 before the pressure-welding step)−height H4 of the upper surface of the encapsulating sheet 6 with the bottom surface of the board 2 after the pressure-welding step as a reference When the pushed-in amount is plus, the encapsulating sheet 6 is excessively pressed to such a degree that the thickness (H4−H2) of the encapsulating sheet 6 after the pressure-welding step becomes thinner than the thickness H3 of the encapsulating sheet 6 before the pressure-welding step. In this way, the encapsulating sheet 6 is brought into close contact with the concave upper surface 10. In contrast, when the pushed-in amount is minus, the encapsulating sheet 6 is adjusted so as to be separated from the concave upper surface 10.

When the absolute value of the pushed-in amount is larger than the depth H1 of the concave portion 7, the lower surface of the encapsulating sheet 6 is not brought into close contact with the circumferential upper surface 11 and the concave portion 7 is not capable of being confined by the encapsulating sheet 6. In contrast, when the absolute value of the pushed-in amount is smaller than the depth H1 of the concave portion 7, the encapsulating sheet 6 is adjusted so as to be brought into close contact with the circumferential upper surface 11.

The absolute value of the pushed-in amount (H2+H3−H4) with respect to the depth H1 of the concave portion 7 is, for example, less than 100%, or preferably 95% or less, and is, for example, above 0%, or preferably 10% or more.

The temperature in the pressure-welding step is, for example, 0° C. or more, or preferably 15° C. or more, and is, for example, 60° C. or less, or preferably 35° C. or less.

In the pressure-welding step, the encapsulating sheet 6 is retained in a state of being pushed down (pushed in) as required.

The duration of retention is, for example, 5 seconds or more, or preferably 10 seconds or more, and is, for example, 10 minutes or less, or preferably 5 minutes or less.

As shown in FIG. 2 (e), by the pressure-welding step, a reduced pressure space 8 that is, in the concave portion 7, defined by the board 2 and the encapsulating sheet 6 and is sealed is formed.

[Atmosphere Releasing Step]

The atmosphere releasing step is a step of releasing the board 2 and the encapsulating sheet 6 under an atmospheric pressure atmosphere.

After the pressure-welding step, by the atmosphere releasing step, the encapsulating sheet 6 is brought into close contact with the concave portion 7 so as to conform to the shape thereof.

To be specific, the operation of the vacuum pump is stopped and the atmosphere in the vacuum chamber is released.

Then, by a differential pressure between a pressure in the reduced pressure space 8 and the atmospheric pressure, the upper surface of the encapsulating sheet 6 is pressed downwardly and the lower surface of the encapsulating sheet 6 is deformed so as to conform to the shape of the concave portion 7 to be brought into close contact with the upper surface of the concave portion 7.

By the atmosphere releasing step, as one example of the semiconductor device, an LED device 1 in which the encapsulating sheet 6 encapsulates the LEDs 4 so as to be in close contact with the concave portion 7 is obtained.

[Curing Step]

In the production of the LED device 1, as shown in FIG. 2 (g), the encapsulating sheet 6 is cured as required (when the encapsulating sheet 6 is a thermosetting resin or an active energy ray curable resin).

When the encapsulating resin is a thermosetting resin, the encapsulating sheet 6 is cured by heating.

When the encapsulating resin is an active energy ray curable resin, the encapsulating sheet 6 is cured by applying an active energy ray thereto from the upper side.

[Two-Step Heating Step]

When the encapsulating sheet 6 is formed from an encapsulating resin composition containing a two-step thermosetting resin, preferably, the encapsulating sheet 6 is cured by a two-step heating step.

The two-step heating step is a step of, after the atmosphere releasing step, heating the encapsulating sheet 6 at a first temperature and thereafter, heating the encapsulating sheet 6 at a second temperature that is higher than the first temperature.

The first temperature is a temperature at which the above-described two-step thermosetting resin in the encapsulating sheet 6 is not completely cured and when the encapsulating sheet 6 is formed from the encapsulating resin composition containing the condensation reaction and addition reaction curable type silicone resin, is a temperature at which an addition reaction (a hydrosilylation reaction) is not progressed.

To be specific, the first temperature is, for example, 80° C. or more, or preferably 100° C. or more, and is, for example, 150° C. or less, or preferably 135° C. or less.

The first temperature is selected from the above range as a fixed temperature (constant temperature).

The heating duration at the first temperature is, for example, 5 minutes or more, or preferably 10 minutes or more, and is, for example, 1 hour or less, or preferably 0.8 hours or less.

The second temperature is a temperature at which the above-described two-step thermosetting resin in the encapsulating sheet 6 is completely cured and when the encapsulating sheet 6 is formed from the encapsulating resin composition containing the condensation reaction and addition reaction curable type silicone resin, is a temperature at which an addition reaction (a hydrosilylation reaction) is progressed.

To be specific, the second temperature is, for example, 135° C. or more, or preferably 150° C. or more, and is, for example, 200° C. or less, or preferably 180° C. or less.

The heating duration at the second temperature is, for example, 0.1 hours or more, or preferably 0.5 hours or more, and is, for example, 20 hours or less, or preferably 10 hours or less.

When the encapsulating sheet 6 that embeds the LEDs 4 is formed from the encapsulating resin composition containing the two-step thermosetting resin, the encapsulating sheet 6 retains its B-stage state and the residual stress in the pressure-welding step is eased by the heating at the first temperature, and the encapsulating sheet 6 is completely cured (subjected to a final curing) to be brought into a C-stage state by the above-described heating at the second temperature.

Also, when the thermosetting resin is formed from the encapsulating resin composition containing the one-step curable type silicone resin, the encapsulating sheet 6 is completely cured (subjected to a final curing) to be brought into a C-stage state by the above-described heating.

The cured (completely cured) encapsulating sheet 6 has flexibility. To be specific, the cured (completely cured) encapsulating sheet 6 has a compressive elastic modulus at 23° C. of, for example, 1 MPa or more, or preferably 1.2 MPa or more, and of, for example, 15 MPa or less, or preferably 10 MPa or less.

When the compressive elastic modulus of the encapsulating sheet 6 is not more than the above-described upper limit, the flexibility can be surely secured. When the compressive elastic modulus of the encapsulating sheet 6 is not less than the above-described lower limit, the wire protective properties can be surely secured.

In this way, the production of the LED device 1 is completed.

[Function and Effect]

According to the method for producing the LED device 1, in the pressure-welding step, the encapsulating sheet 6 is pressure-welded to the board 2 so as to be separated from the concave upper surface 10.

Thus, the pressing force of the encapsulating sheet 6 with respect to the wire 5 at the time of pressure-welding thereof is capable of being reduced.

On the other hand, in the pressure-welding step, the encapsulating sheet 6 confines the circumferential upper surface 11 under a reduced pressure atmosphere, so that the reduced pressure space 8 that is, in the concave portion 7, defined by the board 2 and the encapsulating sheet 6 and is sealed is formed.

Thus, in the atmosphere releasing step, when the atmosphere is released, the encapsulating sheet 6 fills the concave portion 7 without any space by a differential pressure between a pressure in the reduced pressure space 8 and the atmospheric pressure.

Thus, generation of a void between the board 2 and the encapsulating sheet 6 is capable of being suppressed.

As a result, a deformation of the wire 5 is capable of being reduced and the generation of the void is capable of being suppressed.

When the encapsulating sheet 6 is prepared from the encapsulating resin composition containing the two-step thermosetting resin, the method for producing the LED device 1 includes, after the atmosphere releasing step, the two-step heating step in which heating is performed at the first temperature and thereafter, heating is performed at the second temperature that is higher than the first temperature.

In the two-step heating step, the encapsulating sheet 6 is in a B-stage state when heated at the first temperature and the encapsulating sheet 6 is in a C-stage state when heated at the second temperature.

Thus, when the encapsulating sheet 6 is heated at the first temperature, the residual stress in the pressure-welding step is eased and the generation of a void between the lower surface of the encapsulating sheet 6 and the concave upper surface 10 is suppressed, and when the encapsulating sheet 6 is heated at the second temperature, it can be completely cured.

In the method for producing the LED device 1, in the pressure-welding step, when the compressive elastic modulus of the encapsulating sheet 6 is not more than 0.16 MPa, the encapsulation can be performed without applying an excessive pressing force to the wires 5.

In the method for producing the LED device 1, when the depth H1 (the length, in the up-down direction, between the concave upper surface 10 and the circumferential upper surface 11) of the concave portion 7 is not more than 500 μm, the encapsulating sheet 6 is allowed to conform to the shape of the concave portion 7 and is surely capable of being brought into close contact therewith in the pressure-welding step and the atmosphere releasing step.

[First Temperature]

In the above-described embodiment, the first temperature is set to a fixed temperature, but the first temperature is not limited thereto, and the first temperature may have, for example, a temperature range. Specifically, the first temperature may have a heating temperature range in which the temperature increases to the second temperature.

The encapsulating sheet 6 is placed in a dryer set at room temperature (about 20 to 25° C.), and then the dryer is heated so that the temperature inside the dryer reaches the second temperature. In this case, the first temperature has a temperature range from 20° C. or more, or 25° C. or more, to less than the second temperature. The heating rate at the first temperature is, for example, 1° C./min or more, or preferably 2° C./min or more, and is, for example, 30° C./min or less, or preferably 20° C./min or less. The heating time at the first temperature is, for example, 4 minutes or more, or preferably 5 minutes or more, and is, for example, 120 minutes or less, or preferably 60 minutes or less.

Alternatively, it is also possible to place the encapsulating sheet 6 in a dryer set at the fixed temperature mentioned in the above-described embodiment, specifically, the fixed temperature being selected from, for example, a range from 80° C. or more, or preferably 100° C. or more, to, for example, 150° C. or less, or preferably 135° C. or less, then maintain the fixed temperature for a predetermined period of time, and thereafter heat the dryer so that the temperature inside the dryer reaches the second temperature. The duration for which the fixed temperature is maintained is, for example, 3 minutes or more, or preferably 5 minutes or more, and is, for example, 300 minutes or less, or preferably 180 minutes or less. The heating rate is, for example, 1° C./min or more, or preferably 2° C./min or more, and is, for example, 30° C./min or less, or preferably 20° C./min or less. The heating time is, for example, 1 minute or more, or preferably 2 minutes or more, and is, for example, 120 minutes or less, or preferably 60 minutes or less.

As a result of the first temperature having a heating temperature range in which the temperature increases to the second temperature, production efficiency can be improved.

[Mechanical Pressurization]

In the curing step in the above-described embodiment, when the encapsulating sheet 6 is formed from an encapsulating resin composition containing a thermosetting resin, it is also possible to mechanically pressurize the encapsulating sheet 6 while heating the encapsulating sheet 6. Specifically, the encapsulating sheet 6 can be heated and mechanically pressurized at the above-described temperature (heating/mechanical pressurization).

In order to heat and mechanically pressurize the encapsulating sheet 6, as shown by the imaginary line in FIG. 2 (g), for example, a heating/mechanical pressurizing apparatus such as a heat pressing apparatus 10 including flat plates 9 each provided with a heater 12 (or in other words, mechanical heating/mechanical pressurizing apparatus 10), or a pressing apparatus-equipped dryer 13 including a pressing apparatus 10 having flat plates 9 (fluid-heating/mechanical pressurizing apparatus 13) is used. Unlike an autoclave that pressurizes the encapsulating sheet 6 by static pressure (which will be described later), the heating/mechanical pressurizing apparatus is a pressurizing apparatus that pressurizes the encapsulating sheet 6 by physical contact.

To be more specific, in the case where the encapsulating sheet 6 is formed from an encapsulating resin composition containing a two-step thermosetting resin, where the two-step heating step is employed, and where the mechanical heating/mechanical pressurizing apparatus 10 is used, the encapsulating sheet 6 is sandwiched and mechanically pressurized by the flat plates 9 that have been preset to the first temperature by the heater 12, and then, the flat plates 9 are set to the second temperature by the heater 12. Alternatively, the encapsulating sheet 6 is sandwiched and mechanically pressurized by the flat plates 9 set at room temperature. Then, at the first temperature (heating temperature range), the flat plates 9 are heated as described above by the heater 12, so as to cause the flat plates 9 to reach the second temperature.

In the case where the encapsulating sheet 6 is formed from an encapsulating resin composition containing a two-step thermosetting resin, where the two-step heating step is employed, and where the fluid-heating/mechanical pressurizing apparatus 13 is used, in the fluid-heating/mechanical pressurizing apparatus 13 that has been preset to the first temperature, the encapsulating sheet 6 is sandwiched and mechanically pressurized by the pressing apparatus in the fluid-heating/mechanical pressurizing apparatus 13, and then the fluid-heating/mechanical pressurizing apparatus 13 is set to the second temperature (by fluid-heating). Alternatively, in the fluid-heating/mechanical pressurizing apparatus 13 at room temperature, the encapsulating sheet 6 is sandwiched and mechanically pressurized by the pressing apparatus 10, and then the dryer is heated, so as to set the fluid-heating/mechanical pressurizing apparatus 13 to the second temperature (by fluid-heating).

In the fluid-heating/mechanical pressurizing apparatus 13, a gas and/or a liquid in the dryer as a heating medium heats the encapsulating sheet 6.

In the above description, the encapsulating sheet 6 is mechanically pressurized at both of the first temperature and the second temperature in the two-step heating step, but it is also possible to, for example, in the two-step heating step, mechanically pressurize the encapsulating sheet 6 only at the first temperature, and heat the encapsulating sheet 6 at the second temperature without mechanically pressurizing the encapsulating sheet 6 at the second temperature, or in other words, in a normal pressure atmosphere.

Specifically, the encapsulating sheet 6 that has been mechanically pressurized at the first temperature is taken out from the mechanical heating/pressurizing apparatus and then placed in a dryer that has been preset to the second temperature. Particularly when the pressing apparatus-equipped dryer 13 is used, the encapsulating sheet 6 that has been mechanically pressurized at the first temperature is released from the sandwiched state by the flat plates 9, and then the pressing apparatus-equipped dryer 13 is set to the second temperature.

Preferably, the mechanically pressurization is carried out only at the first temperature.

This leads to an improvement in production efficiency.

[Heating and Fluid-Pressurizing Step]

In the above-described embodiment, in the curing step shown in FIG. 2 (g), the two-step heating step is performed using a heating/mechanical pressurizing apparatus. Alternatively, when the encapsulating sheet 6 is formed from the encapsulating resin composition containing the thermosetting resin, the encapsulating sheet 6 can be cured by the heating and fluid-pressurizing step.

The heating and fluid-pressurizing step is a heating and fluid-pressurizing step of heating and fluid-pressurizing the encapsulating sheet 6 after the atmosphere releasing step. In the heating and fluid-pressurizing step, for example, a high-pressure/high-temperature atmospheric processing apparatus 23 (fluid-heating/fluid-pressurizing apparatus) that performs processing in a high-pressure and high-temperature atmosphere such as an autoclave is used. The high-pressure/high-temperature atmospheric processing apparatus 23 is a heating/pressurizing apparatus that utilizes the static pressure of a fluid (a gas and/or a liquid) serving as a heating medium and a pressurized medium. More specifically, the heating and fluid-pressurizing step fluid-heats and fluid-pressurizes the encapsulating sheet 6 with an autoclave after the atmosphere releasing step.

In this case, the encapsulating sheet 6 is uniformly pressurized and heated in all directions, so that the generation of a void can be further surely suppressed, compared to the two-step heating step.

Thus, when the depth H1 of the concave portion 7 is not more than 500 μm, the generation of a void between the lower surface of the encapsulating sheet 6 and the concave upper surface 10 can be suppressed.

Other Modified Examples

In the above-described embodiment, the board 2 is formed into a generally rectangular shape in plane view. However, the shape of the board 2 is not limited to the above-described generally rectangular shape in plane view and may be, for example, a generally circular shape in plane view or a generally polygonal shape in plane view.

In the above-described embodiment, the concave portion 7 is formed into a square shape in plane view. However, the shape of the concave portion 7 is not limited to the above-described square shape in plane view and may be, for example, a generally rectangular shape, a generally circular shape, a generally long hole shape, or another shape.

In the above-described embodiment, one piece of the concave portion 7 is formed in the board 2. However, the number of the concave portion 7 is not particularly limited and may be larger than that in the above-described embodiment.

Figure 4:
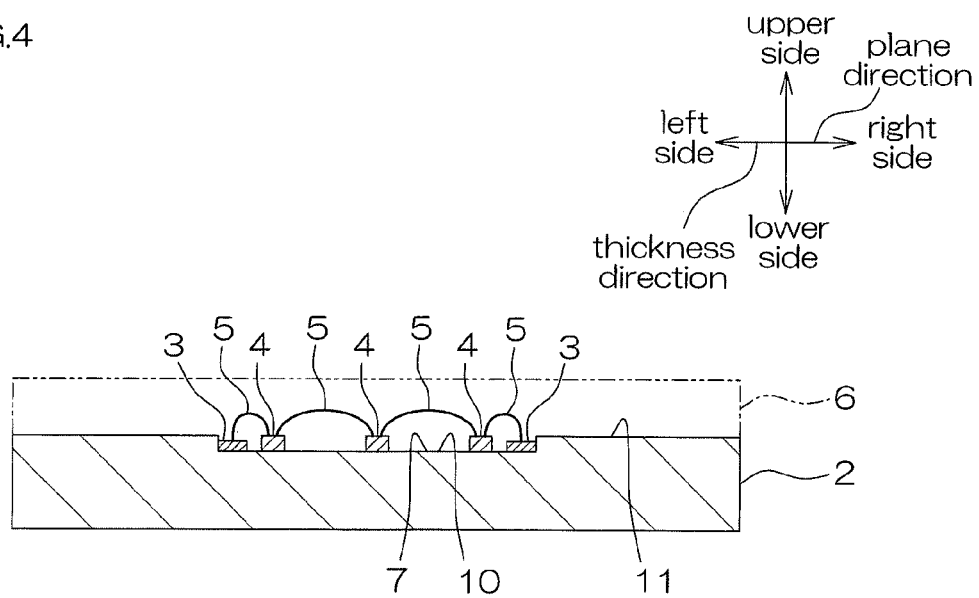
FIG. 4 shows a modified example of the board shown in FIG. 1 (b).

In the above-described embodiment, the terminals 3 are disposed on the circumferential upper surface 11. Alternatively, as shown in FIG. 4, the terminals 3 may be disposed on a portion of the concave upper surface 10 (inside of the concave portion 7) that is at the further outer side of the outermost LEDs 4 in the right-left direction.

In the above-described embodiment, three pieces of the LEDs 4 are disposed in each of the three rows. However, the number of the LED 4 is not particularly limited. The number of the LED 4 may be one or larger than that in the above-described embodiment.

In the above-described embodiment, the height of the top of the curved wire 5 is higher than the circumferential upper surface 11. Alternatively, the height thereof may be lower than the circumferential upper surface 11.

In the above-described embodiment, as shown in FIG. 3, the encapsulating sheet 6 is formed into a sheet shape in a generally rectangular shape in plane view. However, the shape of the encapsulating sheet 6 is not limited to the above-described generally rectangular shape in plane view and may be appropriately set in accordance with the shape of the board 2 and the arrangement of the LED 4. The shape thereof may be, for example, a generally circular shape in plane view or a generally polygonal shape in plane view.

In the above-described embodiment, the LED 4 is described as one example of the semiconductor element of the present invention. Alternatively, for example, though not shown, the semiconductor element of the present invention can also include an electronic element.

The electronic element is a semiconductor element that converts electrical energy to energy other than light, to be specific, to signal energy or the like. Examples thereof include a transistor and a diode. The size of the electronic element is appropriately selected in accordance with its use and purpose.

In this case, the encapsulating sheet 6 contains an encapsulating resin as an essential component and a filler as an optional component. An example of the filler further includes a black pigment such as carbon black. The mixing ratio of the filler with respect to 100 parts by mass of the encapsulating resin is, for example, 5 parts by mass or more, or preferably 10 parts by mass or more, and is, for example, 99 parts by mass or less, or preferably 95 parts by mass or less.

The properties (to be specific, compressive elastic modulus and the like) of the encapsulating sheet 6 are the same as those in the above-described embodiment.

EXAMPLES

While the present invention will be described hereinafter in further detail with reference to Examples and Comparative Examples, the present invention is not limited to these Examples and Comparative Examples.

Example 1

Preparing Step and Wire-Bonding Step

A board in which a concave portion (a square shape in plane view having a depth H1 of 163 μm and a side length of 10 mm) was formed and six pieces of terminals were disposed around the concave portion was prepared (ref: FIG. 1 (a)). Nine pieces of LEDs were disposed on the upper surface of the concave portion (ref: FIG. 1 (b)). The gap between the LEDs was 1.5 mm.

Next, a terminal of each of the LEDs was connected to the corresponding each of the terminals of the board with a wire. The terminals of the LEDs that were adjacent to each other were connected to each other with the wires (ref: FIG. 1 (c)), so that a board mounted with the LEDs was obtained.

[Formation of Encapsulating Sheet]

20 g (1.4 mmol of a vinylsilyl group) of a dimethylvinylsilyl-terminated polydimethylsiloxane (a vinylsilyl group equivalent of 0.071 mmol/g); 0.40 g (1.6 mmol of a hydrosilyl group) of a trimethylsilyl-terminated dimethylsiloxane-methylhydrosiloxane copolymer (a hydrosilyl group equivalent of 4.1 mmol/g); 0.036 mL (1.9 μmol) of a xylene solution (a platinum concentration of 2 mass %) of a platinum-divinyltetramethyldisiloxane complex (a hydrosilylation catalyst); and 0.063 mL (57 μmol) of a methanol solution (10 mass %) of a tetramethylammonium hydroxide (TMAH, a curing retarder) were mixed to be stirred at 20° C. for 10 minutes and then, 30 parts by mass of silicone microparticles (Tospearl 2000B, manufactured by Momentive Performance Materials Inc.) were blended with respect to 100 parts by mass of the obtained mixture to be uniformly stirred and mixed, so that a two-step curable type silicone resin composition was obtained.

The obtained two-step curable type silicone resin composition was applied to a release paper to be cured at 135° C. for 15 minutes, so that an encapsulating sheet prepared from the two-step curable type silicone resin composition in a semi-cured state (a B-stage state) and having a thickness of 1000 μm was obtained (ref: FIG. 1 (d)).

The obtained encapsulating sheet had a compressive elastic modulus (hardness of a sheet) of 0.12 MPa.

[Pressure-Welding Step]

The board mounted with the LEDs and the encapsulating sheet were disposed in opposed relation to each other in the thickness direction. The resulting product was put into a vacuum chamber of a vacuum pressing machine (model number: CV200, manufactured by Nichigo-Morton Co., Ltd.).

The pressure in the vacuum chamber was evacuated with a vacuum pump (a pressure-reducing pump) (model number: E2M80, manufactured by Edwards Japan Limited) and the pressure in the vacuum chamber was reduced to be 50 Pa.

The pushed-in amount (H2+H3−H4) was set to be −100 μm under a reduced pressure atmosphere with a vacuum pressing machine. The board and the encapsulating sheet were pressure-welded to each other to be retained at 20° C. for 3 minutes, so that a reduced pressure space was formed in the concave portion (ref: FIG. 2 (e)).

[Atmosphere Releasing Step]

Next, the vacuum pump was stopped and the atmosphere in the vacuum chamber was released. By a differential pressure between a pressure in the reduced pressure space and the atmospheric pressure, the encapsulating sheet was brought into close contact with the concave portion, so that an LED device was obtained (ref: FIG. 2 (f)).

[Two-Step Heating Step]

The obtained LED device was put into a warm air dryer (model number: DF610, manufactured by YAMATO SCIENTIFIC CO., LTD.) to be first heated at 120° C. (a first temperature) for 10 minutes to be then heated at 150° C. (a second temperature) for 30 minutes (ref: FIG. 2 (g)).

In this way, the LED device that is encapsulated by the encapsulating sheet was capable of being produced.

[Evaluation]

The appearance of the obtained LED device was observed, and a deformation of a wire and generation of a void were evaluated.

Deformation of Wire

Good: Deformation of a wire was not capable of being visually confirmed.

Bad: Deformation of a wire was capable of being visually confirmed.

Generation of Void

Good: Generation of a void was not confirmed.

Poor: Generation of a small void was slightly confirmed.

Bad: A large number of generation of voids was confirmed.

The results of the evaluation are shown in Table 1.

Examples 2 to 4 and Comparative Examples 1 to 6

An LED device was obtained in the same manner as in Example 1, except that the encapsulating sheet having hardness shown in Table 1 was used and the pushed-in amount was set to be that shown in Table 1. The results of the evaluation of the deformation of a wire and the generation of a void are shown in Table 1.

The compressive elastic modulus (hardness of a sheet) of the encapsulating sheet was adjusted by appropriately changing the curing conditions of the encapsulating resin composition.

Example 5

An LED device was obtained in the same manner as in Example 1, except that the board in which the concave portion having a depth shown in Table 2 was formed was used and the encapsulating sheet having hardness shown in Table 2 was used. The results of the evaluation of the generation of a void before and after the curing step are shown in Table 2.

Examples 6 and 7

An LED device was obtained in the same manner as in Example 1, except that the board in which the concave portion having a depth shown in Table 1 was formed was used; the encapsulating sheet having hardness shown in Table 2 was used; and the encapsulating sheet was put into an autoclave (model number: TAS-5-J3R, which is a high-pressure/high-temperature atmospheric processing apparatus (fluid-heating/fluid-pressurizing apparatus) indicated by reference numeral 23 in FIG. 2 (g), manufactured by Taiatsu Techno) to be processed at a heating temperature of 150° C. and a pressure of 0.6 MPa for 30 minutes instead of the two-step heating step. The results of the evaluation of the generation of a void before and after the curing step are shown in Table 2.

TABLE 1

|  | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|
| Hardness of Sheet [MPa] | 0.12 | 0.16 | 0.12 | 0.16 | 0.12 | 0.16 | 0.12 | 0.16 | 0.12 | 0.16 |
| Pushed-in Amount [μm] | −100 | −100 | −150 | −150 | +50 | +50 | +30 | +30 | −200 | −200 |
| Depth of Concave Portion [μm] | 163 | 163 | 163 | 163 | 163 | 163 | 163 | 163 | 163 | 163 |

TABLE 1-continued

|  | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|
| First Temp. in Two-Step Heating Step [° C.] | 120 | 120 | 120 | 120 | 120 | 120 | 120 | 120 | 120 | 120 |
| Heating Duration at First Temp. [min] | 10 | 10 | 10 | 10 | 10 | 10 | 10 | 10 | 10 | 10 |
| Second Temp. in Two-Step Heating Step [° C.] | 150 | 150 | 150 | 150 | 150 | 150 | 150 | 150 | 150 | 150 |
| Heating Duration at Second Temp. [min] | 30 | 30 | 30 | 30 | 30 | 30 | 30 | 30 | 30 | 30 |
| Deformation of Wire | Good | Good | Good | Good | Bad | Bad | Bad | Bad | Good | Good |
| Generation of Void | Good | Good | Poor | Poor | Good | Good | Good | Good | Bad | Bad |

TABLE 2

|  | Ex. 5 | Ex. 6 | Ex. 7 |
|---|---|---|---|
| Hardness of Sheet [MPa] | 0.08 | 0.08 | 0.08 |
| Pushed-in Amount [μm] | −100 | −100 | −100 |
| Depth of Concave Portion [μm] | 150 | 150 | 514 |
| First Temp. in Two-Step Heating Step [° C.] | 120 |  |  |
| Heating Duration at First Temp. [min] | 10 |  |  |
| Second Temp. in Two-Step Heating Step [° C.] | 150 |  |  |
| Heating Duration at Second Temp. [min] | 30 |  |  |
| Heating Temp. in Heating and Pressurizing Step [° C.] |  | 150 | 150 |
| Pressure in Heating and Pressurizing Step [MPa] |  | 0.6 | 0.6 |
| Process Duration in Heating and Pressurizing Step [min] |  | 30 | 30 |
| Generation of Void (Before Curing) | Good | Good | Good |
| Generation of Void (After Curing) | Good | Good | Good |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a semiconductor device comprising:
    a preparing step of preparing a board formed with a concave portion, a terminal disposed in or around the concave portion, and a semiconductor element disposed in the concave portion;
    a wire-bonding step of connecting the terminal to the semiconductor element with a wire;
    a pressure-welding step of pressure-welding an encapsulating sheet to the board so as to be in close contact with the upper surface of a portion around the concave portion and to be separated from the upper surface of the concave portion under a reduced pressure atmosphere; and
    an atmosphere releasing step of releasing the board and the encapsulating sheet under an atmospheric pressure atmosphere.

2. The method for producing a semiconductor device according to claim 1, wherein
    after the atmosphere releasing step, a two-step heating step in which heating is performed at a first temperature and thereafter, heating is performed at a second temperature that is higher than the first temperature is further included.

3. The method for producing a semiconductor device according to claim 2, wherein
    the first temperature has a heating temperature range in which the temperature increases to the second temperature.

4. The method for producing a semiconductor device according to claim 2, wherein
    in the two-step heating step, the encapsulating sheet is mechanically pressurized when heated at the first temperature.

5. The method for producing a semiconductor device according to claim 2, wherein
    the encapsulating sheet is prepared from an encapsulating resin composition containing a two-step thermosetting resin, and
    in the two-step heating step, the encapsulating sheet is in a B-stage state when heated at the first temperature and the encapsulating sheet is in a C-stage state when heated at the second temperature.

6. The method for producing a semiconductor device according to claim 1, wherein
    after the atmosphere releasing step, a heating and fluid-pressurizing step in which the encapsulating sheet is heated and fluid-pressurized is further included.

7. The method for producing a semiconductor device according to claim 1, wherein
   in the pressure-welding step, the encapsulating sheet has a compressive elastic modulus of 0.16 MPa or less.

8. The method for producing a semiconductor device according to claim 1, wherein
   the length between the upper surface of the concave portion and the upper surface of the portion around the concave portion is 500 µm or less.

\* \* \* \* \*